United States Patent

Arora et al.

Patent Number: 6,014,034
Date of Patent: Jan. 11, 2000

[54] METHOD FOR TESTING SEMICONDUCTOR THIN GATE OXIDE

[75] Inventors: Parkash S. Arora, San Antonio; Paul K. Aum, Austin, both of Tex.

[73] Assignee: Texas Instruments Incorporated, Dallas, Tex.

[21] Appl. No.: 08/738,510

[22] Filed: Oct. 24, 1996

[51] Int. Cl.[7] .................................................. G01R 31/26
[52] U.S. Cl. ............................ 324/769; 324/719; 438/17
[58] Field of Search ................................... 324/769, 719, 324/765, 767; 438/17, 18

[56] References Cited

U.S. PATENT DOCUMENTS

| 5,391,502 | 2/1995 | Wei ............................................ 438/17 |
| 5,548,224 | 8/1996 | Gabriel et al. ............................ 324/765 |
| 5,723,982 | 3/1998 | Yasue et al. .............................. 324/765 |
| 5,793,212 | 8/1998 | Om ............................................ 324/719 |

*Primary Examiner*—Ernest F. Karlsen
*Attorney, Agent, or Firm*—W. James Brady, III; Richard L. Donaldson

[57] ABSTRACT

A method for testing thin gate oxide integrity of a semiconductor device includes the steps of performing a current or voltage ramp test on the thin gate oxide semiconductor device. The resultant current and voltage data points indicating an increasing magnitude of current flowing through the thin gate oxide and corresponding increasing magnitude of voltage across the thin gate oxide are measured and recorded (14, 16). A slope is then computed between each successive pair of data points and stored (20). Each successive pair of computed slopes are then compared against a predetermined setpoint (22), where a possible kink point is detected if a pair of successive computed slopes has a difference greater than the predetermined setpoint (24).

18 Claims, 3 Drawing Sheets

METHOD FOR TESTING SEMICONDUCTOR THIN GATE OXIDE

TECHNICAL FIELD OF THE INVENTION

This invention is related in general to the field of semiconductor processing and testing. More particularly, the invention is related to a method for testing the integrity of semiconductor thin gate oxide.

BACKGROUND OF THE INVENTION

Currently, testing to determine gate oxide process-induced damage on semiconductor devices has been performed by supplying a test current or voltage ramp to the gate oxide until gate oxide breakdown. This method works well for devices with gate oxides having a thickness of 100 Å or more. However, incorrect breakdown current, voltage, and/or charge information are often provided by this method due to the different gate oxide current vs. voltage characteristics of devices with thin gate oxides less than 100 Å thick. In thin gate oxide devices, the tunneling current becomes a much more dominant component of the current flowing through the gate oxide during a current or voltage ramp test. This alters the breakdown characteristics of the device and may lead to incorrect conclusions on the integrity of the gate oxide in these devices.

Accordingly, there is a need for a test method to determine thin gate oxide integrity of semiconductor devices to detect plasma damage and other process-induced damage effects that may lead to abnormally high breakdown voltages, series resistance, early breakdown, early leakage, and self healing phenomena.

SUMMARY OF THE INVENTION

In accordance with the present invention, a method for testing thin gate oxide integrity is provided which eliminates or substantially reduces the disadvantages associated with prior tests and methods.

In one aspect of the invention, a method for testing thin gate oxide integrity of a semiconductor device includes the steps of performing a current or voltage ramp test ($Q_{bd}$ test) on the thin gate oxide semiconductor device. The current and voltage data points indicating an increasing magnitude of current flowing through the thin gate oxide and corresponding increasing magnitude of voltage across the thin gate oxide are measured and recorded. A slope is then computed between each successive pair of data points and stored. Each successive pair of computed slopes are then compared in view of a predetermined setpoint, where a possible kink point is detected if the computed slopes have a difference greater than the predetermined setpoint.

In another aspect of the invention, the method further makes comparisons of slopes beyond the point where the large slope difference is detected to ensure the difference in slope is not localized.

In yet another aspect of the invention, the detected kink point voltage and current are compared to a predetermined voltage and current range. A kink point falling outside of the range would be flagged as an error.

BRIEF DESCRIPTION OF THE DRAWINGS

For a better understanding of the present invention, reference may be made to the accompanying drawings, in which.

DETAILED DESCRIPTION OF THE INVENTION

Figure 1:
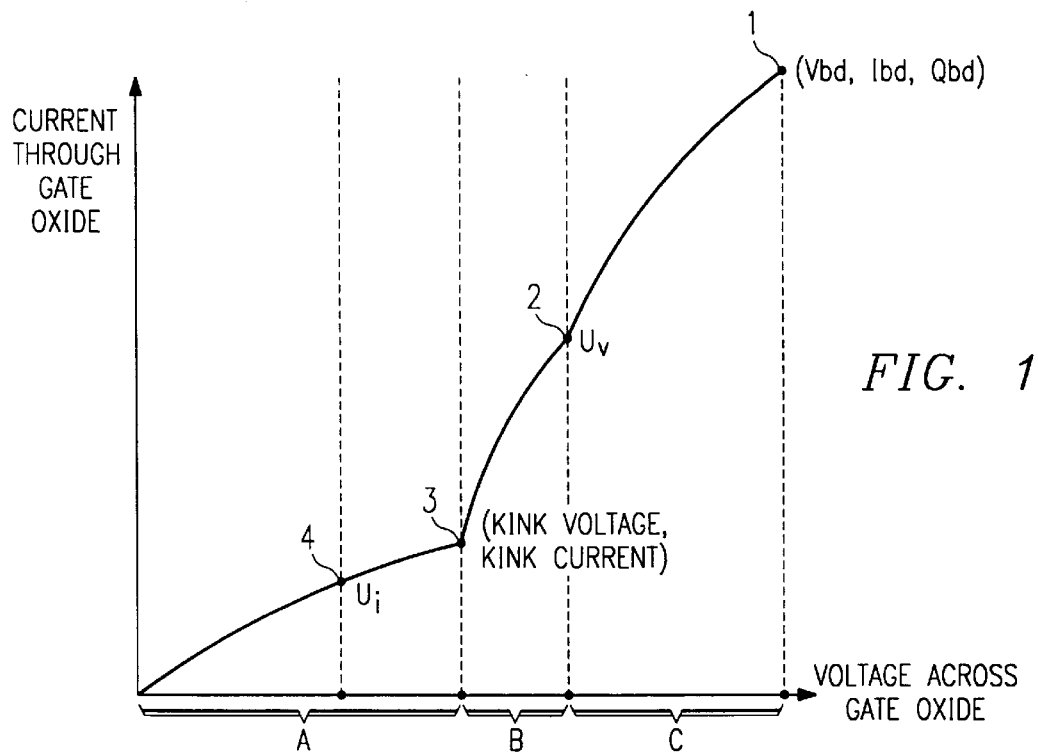
FIG. 1 is a plot of current vs. Voltage through the gate oxide generated by a current density ramp or voltage ramp.

The preferred embodiments(s) of the present invention is (are) illustrated in FIGS. 1–4, like reference numerals being used to refer to like and corresponding parts of the various drawings.

Referring to FIG. 1, a plot of current through the thin gate oxide versus voltage across the thin gate oxide of a semiconductor device is shown. The semiconductor device (not shown) in question has a thin gate oxide layer that is defined to be less than 100 Å. Examples of the semiconductor device include transistors and capacitors.

The curve in FIG. 1 may be generated by conventional voltage ramp or current-density ramp tests (also known as $Q_{bd}$ tests) while monitoring either current though the gate oxide or the voltage built-up across the gate oxide, respectively. The voltage and current ramp tests may be performed according to industry JEDEC standards or any other suitable parameters by increasing the current or voltage in a stepwise manner until gate oxide breakdown occurs.

In FIG. 1, gate oxide breakdown is characterized by a sudden voltage drop at point 1. Point 2 designates the starting point of a region C where impact ionization-induced gate oxide current becomes a dominant component in the gate oxide current. In a region B, thin gate oxide tunneling current dominates, beginning at point 3. The voltage across the gate oxide and current flowing through the gate oxide at point 3 is designated as the tunneling voltage and current, or the kink voltage and current, respectively. For gate oxides having a thickness greater than and equal to 100 Å, the kink point 3 occurs at a much higher voltage, thereby reducing region B and also the contribution of the tunneling current to the total current. Region A denotes the region where the gate oxide capacitor displacement current dominates. The voltage across the gate oxide at a given current density is denoted by the variable $U_v$. The current in the gate oxide for a given voltage is designated by the variable $U_i$.

Figure 2:
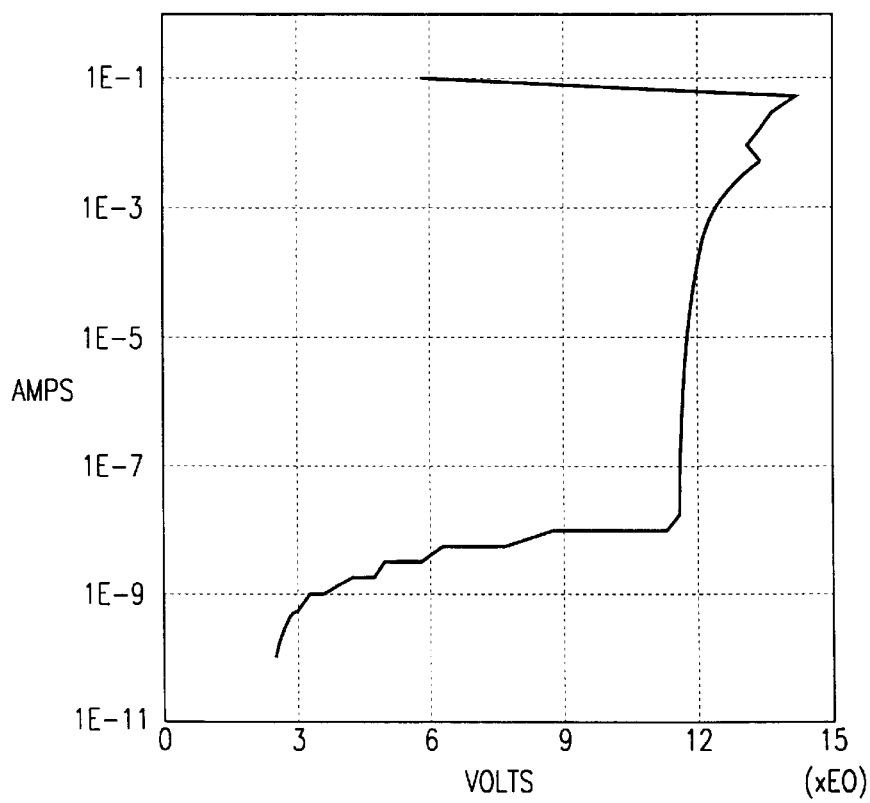
FIG. 2 is an actual current vs. voltage plot of a thin gate oxide device exhibiting a kink point.
Figure 3:
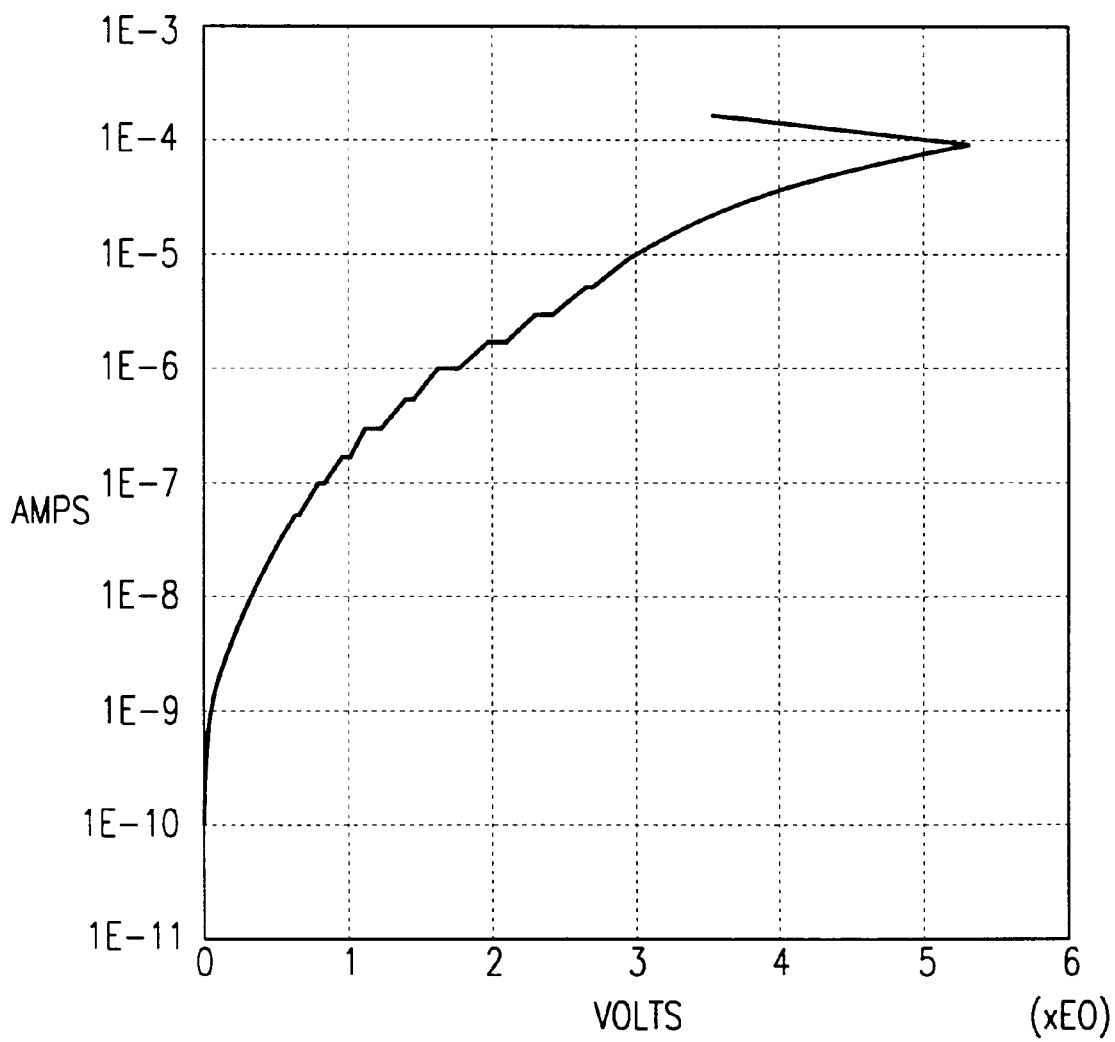
FIG. 3 is an actual current vs. voltage plot of a thin gate oxide device lacking a kink point.

FIG. 2 is a typical plot of thin gate oxide current and voltage exhibited during voltage or current ramp. The kink point at 11.6 volts and $1.55 \times 10^{-8}$ amps is distinct and clearly visible. In comparison, FIG. 3 shows a plot of a thin gate oxide with process-induced damage. The plot shows that breakdown was reached, but there is no kink point. Other thin gate oxides with process-induced damage may not even reach breakdown with or without the existence of the kink point. The test method in accordance with the present invention involves the analysis of the plot to identify the kink point, since the absence of the kink point conclusively determines process-induced damage of the thin gate oxide being tested. The computation of certain parameters, such as $Q_{bdt}$ (charge to breakdown), breakdown voltage and current, current at a specified voltage, and voltage at a specified current density, from the ramp plots are known and are not discussed in detail herein.

Figure 4:
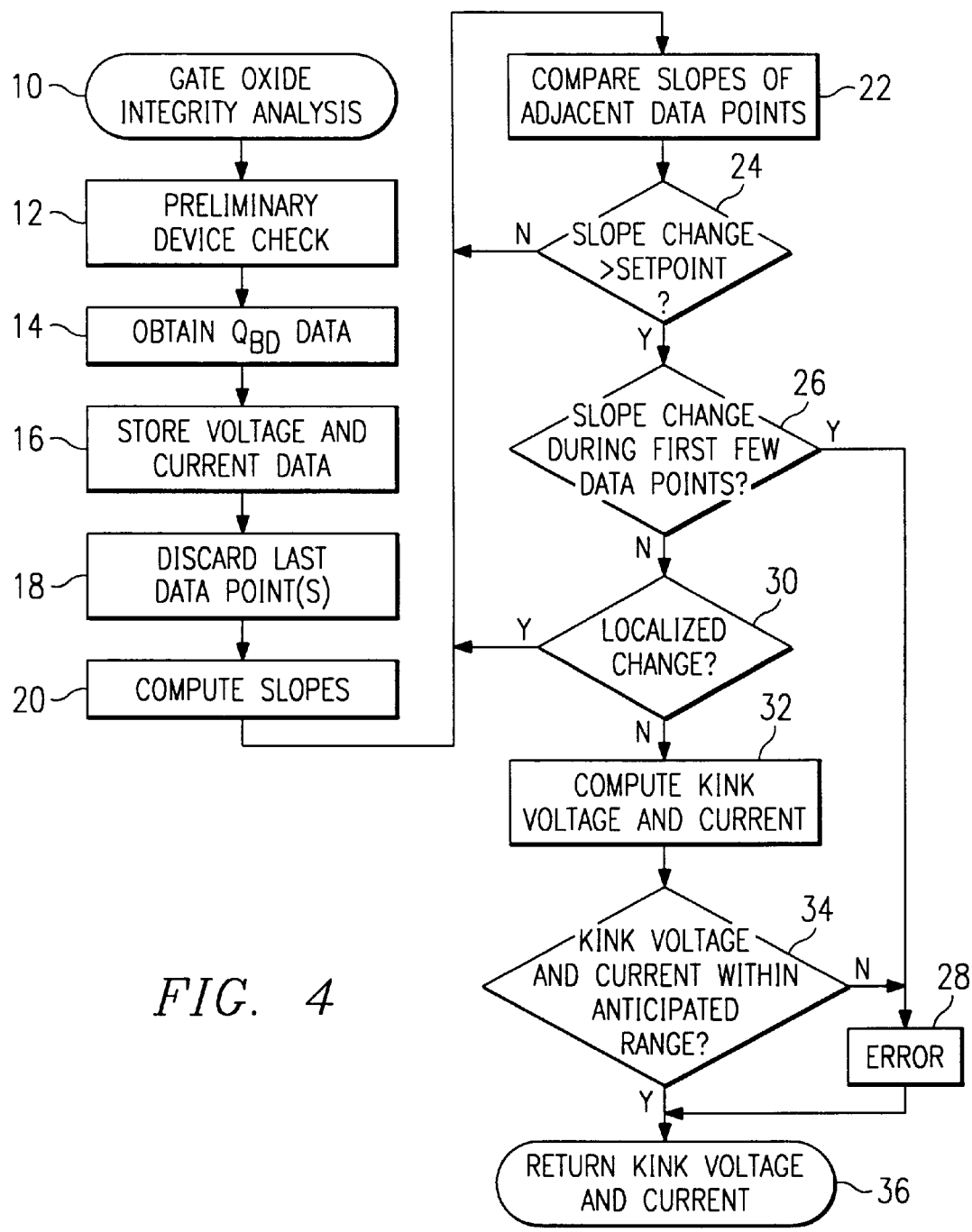
FIG. 4 is a flowchart of an embodiment of the thin gate oxide integrity test method according to the teachings of the invention.

Referring to FIG. 4, a simplified flowchart describing the thin gate oxide integrity test 10 is shown. Prior to the ramp or $Q_{bd}$ test, a preliminary test is first performed on the device, as shown in block 12. The preliminary test serves to weed out damaged devices by subjecting the gate oxide to a known voltage and checking the current flowing through the gate oxide as a result. If the measured current is out of range, then the device can be flagged as failing the preliminary device check and rejected as damaged. Other similar known gate oxide tests may be used herein to serve the same purpose.

Subsequently in block 14, a current or voltage ramp ($Q_{bd}$ test) is performed on the device by forcing increasing current or voltage on the gate oxide. The resulting voltage and current is measured at each level and recorded, as shown in block 16. The current and voltage ramp may be performed according to the JEDEC standard or some other procedure designed to increasingly stress the gate oxide to the point of breakdown.

In order to ensure accuracy, one or more of the last current and voltage data points at and after breakdown are discarded, as shown in block 18. Thereafter, the current and voltage data points are used to compute the changing slope of the data, as shown in block 20. The computation begins with data points derived at breakdown in the direction of decreasing voltage and current. For example, if the data consist of fifty points or (I, V) pairs, the computation would begin with the calculation of a slope between points ($I_{49}$, $V_{49}$) and ($I_{48}$, $V_{48}$), and then the slope between points ($I_{48}$, $V_{48}$) and ($I_{47}$, $V_{47}$), and then the slope between points ($I_{47}$, $V_{47}$) and ($I_{46}$, $V_{46}$), etc. until all the slope between all the points are determined. The calculated slopes are then stored in a data structure, such as an indexable array, for easy access, so that comparisons of the slopes may be performed, as shown in block 22. If the slopes of adjacent data points change more than a predetermined setpoint, as shown in block 24, for example greater than a 30% change, then a valid kink point may have been detected. However, additionally assurances are necessary in order to affirmatively verify the existence of a valid kink point.

In block 26, if the detected large slope change occurred during the first few data points, then some error may have occurred in data gathering or calculations to produce the significant change in slope. Such a change in slope is not a kink point, and an error is flagged, as shown in block 28. Similarly, if the slope change is localized, as determined in block 30, it may be due to noise or other unrelated reasons, which means the slope change does not indicate a valid kink point. The localized nature of the slope change may be determined by comparing the slope of points before and after the point at which the slope changed significantly.

For example, if the significant slope change occurred between the nth slope and the n+1 slope, then the n+2 and n−3 slopes are compared. If these slopes are equal or very similar, then the significant slope change that was detected is localized and does not indicate a valid kink point. Slope comparison then continues in block 22.

However, if the change is not localized then the kink point voltage and current are computed in block 32. The kink voltage and current are voltage and current at which point tunneling begins. An additional check compares the computed kink voltage and/or current with a predetermined range, as shown in block 34. An exemplary comparison may be, if the absolute value of the kink voltage is less than three or greater than 30, then the kink voltage is outside the range. If the computed kink voltage and/or current fall outside a predetermined range, then an error has occurred and the kink point is not valid, as shown in blocks 34 and 28. Otherwise, the detected kink point is valid, and the computed kink voltage and current are returned. Additionally, any other parameters such as flags indicating failure modes, breakdown voltage, breakdown current, and charge to breakdown may be returned as well.

Although not discussed in detail herein, the invention contemplates the use of flags to indicate certain failure modes and test results. For example, if all the slopes have been compared with adjacent slopes and no significant slope change is found, then there is no kink point, and the device failed the test. Therefore possible failure modes that may be flagged include: passed preliminary test, normal breakdown but no kink point, failed to breakdown but kink point was found, no breakdown and no kink point.

From this test, the lack of a valid kink point in a voltage or current ramp curve of a device indicates that the thin gate oxide of the device has process-induced damage. Accordingly, the existence or absence of the kink point is accurately detected by the method according to the present invention.

Although the present invention and its advantages have been described in detail, it should be understood that various changes, substitutions and alterations can be made therein without departing from the spirit and scope of the invention as defined by the appended claims.

What is claimed is:

1. A method for testing thin gate oxide integrity of a semiconductor device, comprising the steps of:

performing a ramp test on said thin gate oxide, and measuring and recording a plurality of data points indicating an increasing magnitude of current flowing through said thin gate oxide and corresponding increasing magnitude of voltage across said thin gate oxide;

computing a slope between each successive pair of data points and storing a plurality of computed slopes;

comparing each successive pair of computed slopes; and identifying a possible kink point in response to a pair of successive computed slopes having a difference greater than a predetermined setpoint.

2. The method, as set forth in claim 1, where the step of identifying a possible kink point includes the step of identifying a possible kink point when the difference is greater than 30%.

3. The method, as set forth in claim 1, further comprising the step of determining that the slope difference is not localized.

4. The method, as set forth in claim 1, further comprising the step of comparing the computed slopes of current and voltage data pairs beyond the slopes having a large difference in order to determine that the large slope difference is not localized.

5. The method, as set forth in claim 1, further comprising the step of determining whether the detected kink point occurred outside a predetermined voltage and current range.

6. The method, as set forth in claim 1, further comprising the step of discarding a number of initial and final data points.

7. The method, as set forth in claim 1, further comprising the step of computing a kink voltage and current.

8. A method for testing thin gate oxide integrity of a semiconductor device by analyzing a plurality of current and voltage data pairs generated by a current or voltage ramp test, comprising the steps of:

computing a plurality of slopes of each two adjacent current and voltage data pairs and storing said plurality of computed slopes;

comparing the computed slopes of adjacent current and voltage data pairs; and identifying a possible kink point in response to slopes of adjacent current and voltage data pairs having a difference greater than a predetermined setpoint, a lack of a kink point being indicative of a damaged thin gate oxide.

9. The method, as set forth in claim 8, where the step of identifying a possible kink point includes the step of identifying a possible kink point when the difference is greater than 30%.

10. The method, as set forth in claim 8, further comprising the step of determining the slope difference is not localized.

11. The method, as set forth in claim 8, further comprising the step of comparing the computed slopes of current and voltage data pairs beyond the slopes having a large difference in order to determine that the large slope difference is not localized.

12. The method, as set forth in claim 8, further comprising the step of determining whether the detected kink point occurred outside a predetermined voltage and current range.

13. The method, as set forth in claim 8, further comprising the step of discarding a number of initial and final data points.

14. The method, as set forth in claim 8, further comprising the step of computing a kink voltage and current.

15. A method for testing a semiconductor device having a thin gate oxide for possible process-induced damage, comprising the steps of:

performing a current or voltage ramp test on said thin gate oxide, and measuring and recording a plurality of data points indicating an increasing magnitude of current flowing through said thin gate oxide and corresponding increasing magnitude of voltage across said thin gate oxide;

computing a slope between each pair of successive data points and storing a plurality of computed slopes;

comparing each pair of successive computed slopes;

identifying a possible kink point in response to a pair of successive commuted slopes having a difference greater than a predetermined setpoint;

comparing the computed slopes of current and voltage data pairs beyond the slopes having a large difference in order to determine that the large slope difference is not localized;

computing a kink voltage and current at the detected kink point; and determining whether the computed kink current and voltage are outside a predetermined current and voltage range.

16. The method, as set forth in claim 15, further comprising the step of discarding a number of initial and final data points.

17. The method, as set forth in claim 15, wherein said slope computing step further comprises the step of storing the computed slopes in an indexable array.

18. The method, as set forth in claim 15, where the step of identifying a possible kink point includes the step of identifying a possible kink point when the difference is greater than 30%.

* * * * *